United States Patent [19]

Nakamura et al.

[11] Patent Number: 4,586,063
[45] Date of Patent: Apr. 29, 1986

[54] SCHOTTKY BARRIER GATE FET INCLUDING TUNGSTEN-ALUMINUM ALLOY

[75] Inventors: Hiroshi Nakamura; Katsuzo Kaminishi; Toshio Nonaka; Toshimasa Ishida, all of Tokyo, Japan

[73] Assignee: Oki Electric Industry Co., Ltd., Tokyo, Japan

[21] Appl. No.: 595,873

[22] Filed: Apr. 2, 1984

[51] Int. Cl.[4] .............. H01L 29/48; H01L 29/80; H01L 23/48; H01L 29/56
[52] U.S. Cl. .................................. 357/22; 357/15; 357/67; 148/139; 148/140; 427/84
[58] Field of Search .............. 357/15, 22, 67; 148/139, 140; 427/84

[56] References Cited

U.S. PATENT DOCUMENTS

| | | |
|---|---|---|
| 3,652,905 | 3/1972 | Page ........................ 357/15 |
| 4,017,890 | 4/1977 | Howard et al. ............ 357/67 |
| 4,048,646 | 9/1977 | Ogawa et al. ............. 357/15 |
| 4,048,712 | 9/1977 | Buiatti ....................... 357/15 |
| 4,141,020 | 2/1979 | Howard et al. ............ 357/15 |

OTHER PUBLICATIONS

Yokoyama et al, "Ti/W Silicide Gate Technology for Self-Aligned GaAs MESFET V1SIS", IEEE 1981, IEDM 81, pp. 80-83.

*Primary Examiner*—James J. Carroll
*Attorney, Agent, or Firm*—Pollock, VandeSande & Priddy

[57] ABSTRACT

A semiconductor device and a method of manufacturing the same are disclosed. The device comprises a GaAs semiconductor body, a source and a drain region formed in the semiconductor body, a channel region placed between the source and drain regions, a source and a drain electrodes provided by patterning treatment onto the surfaces of the source and drain regions and making ohmic contact thereto, and a gate electrode provided onto the surface of the channel region and consisting of a W-Al alloy. The method comprises steps of providing a GaAs semiconductor body as a substrate, forming an active layer into the body, forming a pattern of a W-Al alloy as a gate electrode, implanting donor ion with high concentration into a region including a portion of the active layer other than the underlying region of the portion on which the gate electrode is at least provided thereby forming a source and a drain region, subjecting the semiconductor body to an annealing treatment to activate the active layer and the source and drain regions, and providing ohmic contacts onto the source and drain regions.

1 Claim, 6 Drawing Figures

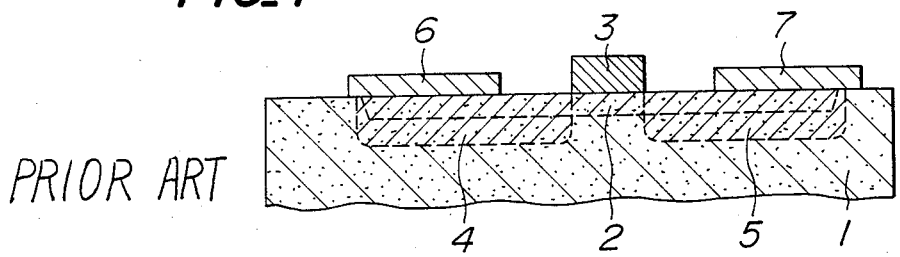
FIG_1 PRIOR ART
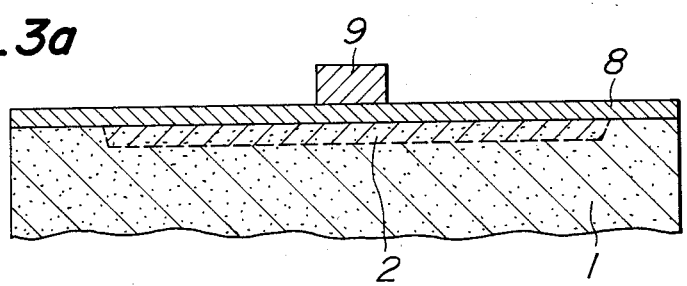
FIG_3a
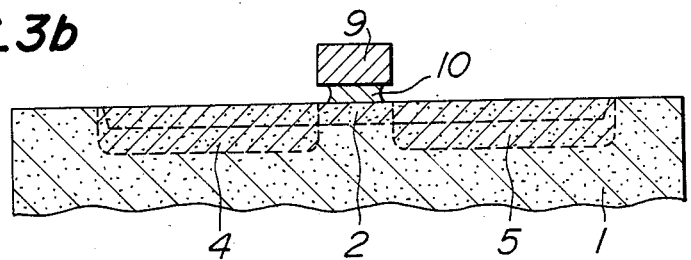
FIG_3b
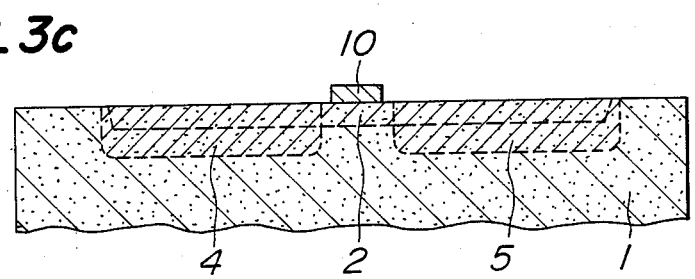
FIG_3c
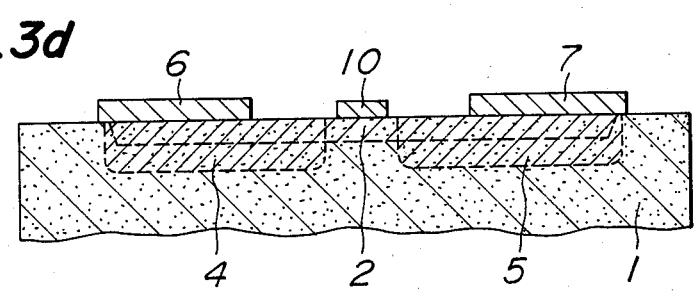
FIG_3d

SCHOTTKY BARRIER GATE FET INCLUDING TUNGSTEN-ALUMINUM ALLOY

BACKGROUND OF THE INVENTION

The present invention relates to a semiconductor device, particularly, a self-aligned field effect transistor formed on a GaAs substrate as a MES structure, and to a method of manufacturing the same.

Such a conventional self-aligned field effect transistor, as shown in FIG. 1, comprises a semi-insulating GaAs substrate 1, an n conductivity type GaAs layer (active layer) 2 having thickness of a few thousands angstrom formed by implanting donor ion into the GaAs substrate 1, a gate electrode 3 formed on a surface of the GaAs layer 2, n+type GaAs layers 4 and 5 with low resistivity (source and drain regions) formed by implanting donor ion with high concentration into the GaAs layer 2 at both sides of the gate electrode 3, and source and drain electrodes 6 and 7 formed on the surface of the low resistivity GaAs layers 4 and 5. The source and drain electrodes 6 and 7 are ohmic contacts to the GaAs substrate; the gate electrode 3 is a Schottky contact to the GaAs substrate.

In such a field effect transistor the n type GaAs layers 4 and 5 with low resistivity (the source and drain regions) are formed by the self-alignment process. That is, after the n type GaAs layer 2 is formed by ion implantation of donor ion, the gate electrode 3 is formed and then the n+type GaAs layers 4 and 5 with low resistivity are formed by implanting the donor ion with high concentration into the GaAs substrate 1 with the use of the gate electrode 3 as mask, thereafter the source and drain electrodes 6 and 7 are formed on the low resistivity GaAs layers 4 and 5, so that the essential space between the n+type GaAs layers (source and drain regions) 4 and 5 with low resistivity can be reduced to the length equal to that of the gate electrode 3, that is, to the extent of about 1 $\mu$m.

In such a field effect transistor the material of the gate electrode 3 must be taken into consideration. That is, the heat treatment (800° C. to 850° C.) for recovery of crystallinity of the n type GaAs layers 4 and 5 (ion implanted layer) must be effected so that the gate electrode material should not be changed in quality at the temperature of 800° C. to 850° C. and the characteristics of rectifying contact between the gate electrode and the GaAs substrate should not be deteriorated by heat treatment with the temperature of 800° C. to 850° C.

For the gate electrode, material having such a characteristic has been developed. One gate electrode material is metal silicides having high melting point such as tungsten silicide, titanium silicide, tantalum silicide or the like. Schottky characteristics between these silicides and GaAs are stable at high temperature heat treatment but their resistivity is high and more than 200 $\mu\Omega$m so that the gate electrode must be thickened.

The other gate electrode material is a pure tungsten-metal. The tungsten-metal is substantially low resistivity and the content between tungsten-metal and GaAs has comparatively low barrier height of the rectifying contact characteristics and low reverse breakdown voltage so that development of new gate material having low resistivity and high thermal resistance is expected.

SUMMARY OF THE INVENTION

It is an object of the present invention to provide a semiconductor device in which the above problem of conventional gate electrode material has been solved and to provide a method of manufacturing such a semiconductor device.

According to the present invention there is provided a method of manufacturing a semiconductor device comprising steps of providing a GaAs semiconductor body as substrate, forming an active layer into the body, forming a pattern of a W-Al alloy as a gate electrode, implanting donor ions with high concentration into a region including a portion of the active layer other than the underlying region of the portion on which the gate electrode is at least provided thereby forming a source and a drain, subjecting the semiconductor body to an annealing treatment to activate the active layer and the source and drain regions, and providing ohmic contacts onto the source and drain regions.

According to the present invention there is also provided a semiconductor device comprising a GaAs semiconductor body, a source and a drain region formed in the semiconductor body, a channel region placed between the source and drain regions, a source and a drain electrode provided by patterning treatment onto the surface of the source and drain regions and making ohmic contact thereto, and a gate electrode provided onto the surface of the channel region and consisting of a W-Al alloy.

BRIEF DESCRIPTION OF THE DRAWING

These and other features and advantages of the present invention will become readily apparent from the following detailed description of one embodiment of the present invention, particularly when taken in connection with the accompanying drawings wherein like reference numerals designate like or functionally equivalent parts, and wherein:

FIG. 1 is a sectional view showing a conventional field effect transistor manufactured by the self-alignment technique;

FIGS. 3a to 3d are sectional view showing step of method of manufacturing a semiconductor device according to the present invention.

DESCRIPTION OF THE PREFERRED EMBODIMENT

Figure 2:
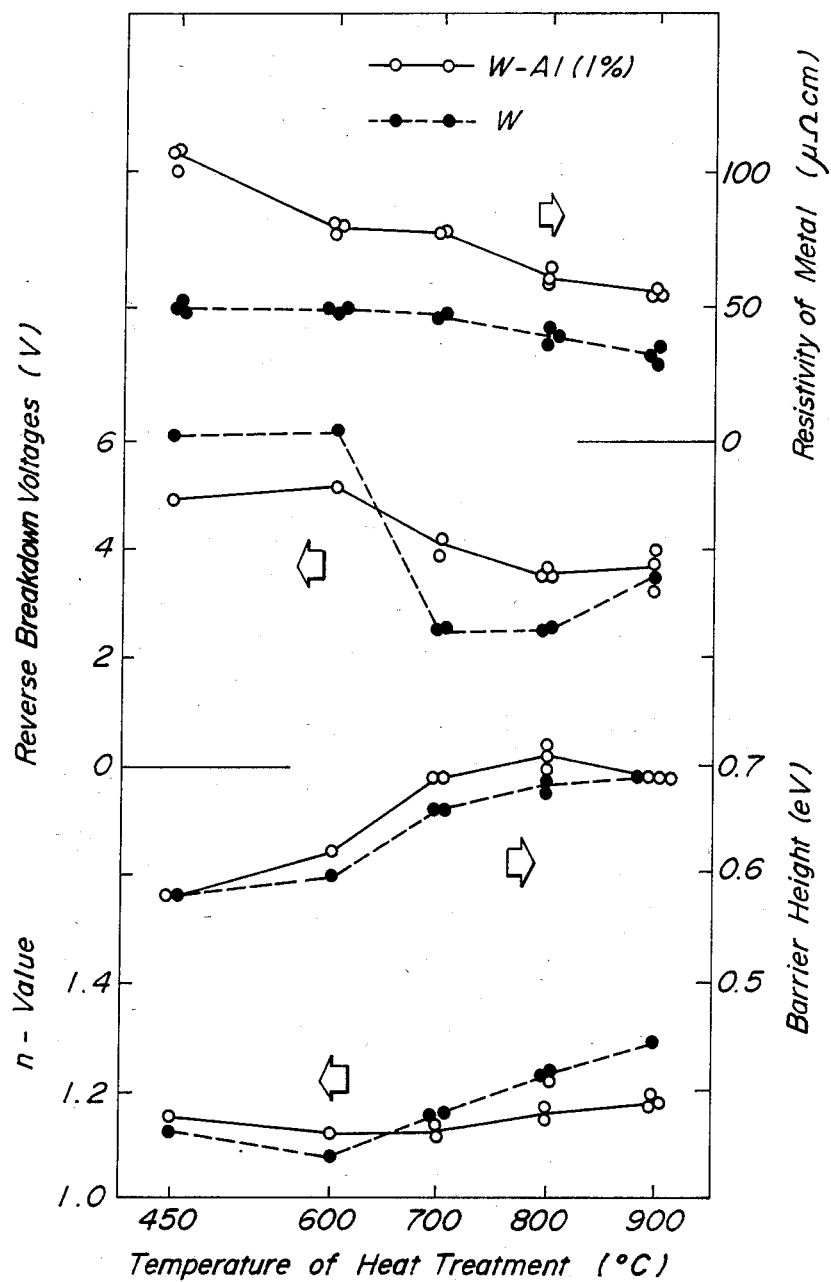
FIG. 2 is a view showing experimental results of changes in rectifying contact characteristics for W-Al alloy and W due to temperature of heat treatment.

Referring now to the drawings, there is shown an embodiment of a method of manufacturing a semiconductor device according to the present invention.

FIG. 2 shows experimental results of changes in characteristics of rectifying contact between an alloy of tungsten and aluminum (hereinafter referred to as W-Al alloy) due to temperature of heat treatment compared with only tungsten (hereinafter referred to as W). In this experiment a GaAs substrate of n conductivity type having electron concentration of $2\times10^{17}/cm^3$ is used as a substrate. The formation of metal film is performed by RF sputtering. After formation of the metal film it is subjected to a patterning process thereby forming a circular pattern having a diameter of 160 $\mu$m and then heat treatments with cap by CVD.SiO$_2$ are performed at respective temperatures for 20 minutes.

As seen from FIG. 2, particularly, after heat treatment at 800° C. the characteristics of rectifying contact between W-Al alloy film including aluminum (Al) of 1 atom % and the GaAs substrate is improved as compared with the characteristics of rectifying contact between W film and the GaAs substrate. That is, according to the W-Al alloy the n-value showing the ideality of rectifying contact characteristics is lower and much nearer to 1.0, the barrier height (the higher the better in the application to MESFET) is higher and the reverse breakdown voltage is higher than those of the W film. As seen from the above result it is evident that the rectifying contact characteristics for the W-Al alloy including few Al is superior to that for the W film. In the W-Al alloy, the amount of Al may preferably be 0.5 to 3 atom %, since the W-Al alloy including Al of 0.5 atom % or less has n-value of about 1.9 (substantially equal to n−value of W) after annealing treatment resulting in a deterioration of Schottky contact characteristic, and the W-Al alloy including Al of 3 atom % or more has a sheet resistance which is 4 times that of the alloy including Al of 1 atom %.

At the same time FIG. 2 shows changes in resistivity of metal due to temperature, wherein resistivity of the W-Al alloy at 800° C. is 1.5 times that of the W film. This resistivity value is fairly low as compared with that of heat-resisting gate electrode material of other silicide systems.

As described above the W-Al alloy is superior to the silicide material as a gate electrode material since it has lower resistance than that of the silicide material and superior rectifying contact characteristic to that of the W film.

FIGS. 3a to 3d show one embodiment of a method of manufacturing a semiconductor device according to the present invention in which the above described W-Al alloy is utilized as a gate electrode. In this embodiment the semiconductor device is a field effect transistor. At first, as shown in FIG. 3a, a GaAs semi-insulating substrate 1 is prepared as a semiconductor body. After an active layer 2 is formed in the substrate by selective ion implantation a W-Al alloy film 8 with a thickness of about 1000 angstroms is applied onto whole surface of the substrate 1 by sputtering and a metal gate pattern 9 of Ti and/or Ni with a thickness of about 3000 angstroms is formed onto the W-Al alloy film. Formation of the gate pattern is performed by a lift-off technique or an ion-milling method. As shown in FIG. 3b, next, the W-Al alloy film 8 is etched by the plasma of CF$_4$ system with the use of the metal gate pattern 9 as a mask. After etching the W-Al alloy film 8 is subjected to a slight side etching as shown by reference numeral 10. Donor ions of such as Si with high concentration are then implanted into the substrate 1 with the use of a two layer metal film 9, 10 as a mask and a resist for the portion other than the active layer as a mask, thereby forming a source region 4 and a drain region 5. As shown in FIG. 3c, after removing the upper metal 9 on the gate electrode 10 by etching the substrate 1 is subjected to a heat treatment at the temperature of about 800° C. to activate the regions 4 and 5 thereby obtaining the region having low resistance. As shown in FIG. 3d, at last, a source electrode 6 and a drain electrode 7 of ohmic contact are formed onto the source region 4 and the drain region 5.

In the field effect transistor according to the present invention the gate electrode metal 10 and the source and drain region 4, 5 are not in contact with each other so that the rectifying contact characteristic of the gate and the GaAs substrate are improved and high speed performance of the field effect transistor can be obtained. That is according to the present invention the gate and the source and drain regions do not contact with each other so that the gate stray capacity becomes small thereby obtaining high speed performance and Schottky characteristics can be improved. In order to integrate such a construction of the field effect transistor with high density the thickness of the gate electrode 10 must be decreased. Moreover, in order to make the thickness of the gate electrode thin as well as to reduce the gate resistance the resistivity of the gate metal must be reduced. To this end the gate electrode material having low resistivity and high thermal resistance according to the present invention can preferably be used so that a GaAs logic integrated circuit having high speed, high integration and high yield can be provided.

What is claimed is:

1. A semiconductor device comprising a GaAs semiconductor body, a source region and a drain region formed by self-alignment technique in the semiconductor body, a channel region placed between the source and drain regions, a source electrode and a drain electrode provided by patterning treatment onto the surfaces of the source and drain regions and making ohmic contact thereto, and a gate electrode provided onto the surface of the channel region, the gate electrode consisting of a W-Al alloy, the W-Al alloy having a composition of Al of 0.5 to 3 atom % and W of the residue.

* * * * *